(12) United States Patent
Francis et al.

(10) Patent No.: US 8,314,002 B2
(45) Date of Patent: Nov. 20, 2012

(54) SEMICONDUCTOR DEVICE HAVING INCREASED SWITCHING SPEED

(75) Inventors: Richard Francis, Manhattan Beach, CA (US); Chiu Ng, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 1062 days.

(21) Appl. No.: 11/144,727

(22) Filed: Jun. 2, 2005

(65) Prior Publication Data

US 2005/0227461 A1 Oct. 13, 2005

Related U.S. Application Data

(62) Division of application No. 09/565,973, filed on May 5, 2000, now abandoned.

(51) Int. Cl.
*H01L 21/331* (2006.01)

(52) U.S. Cl. ............... 438/370; 438/526; 257/E21.357; 257/E21.382

(58) Field of Classification Search .......... 438/335–336, 438/338, 342, 370, 377, 526; 257/E21.337, 257/E21.382
See application file for complete search history.

(56) References Cited

U.S. PATENT DOCUMENTS

| | | | | |
|---|---|---|---|---|
| 3,776,770 A | * | 12/1973 | Lando | ............................ 438/514 |
| RE33,209 E | | 5/1990 | Plummer | |
| 5,105,244 A | | 4/1992 | Bauer | |
| 5,141,889 A | * | 8/1992 | Terry et al. | ..................... 438/138 |
| 5,171,696 A | | 12/1992 | Hagino | |
| 5,178,370 A | | 1/1993 | Clark et al. | |
| 5,183,769 A | * | 2/1993 | Rutter et al. | ................... 438/138 |
| 5,270,230 A | | 12/1993 | Sakurai | |
| 5,273,917 A | * | 12/1993 | Sakurai | ......................... 438/138 |
| 5,286,655 A | | 2/1994 | Tsunoda | |
| 5,331,184 A | | 7/1994 | Kuwahara | |
| 5,369,291 A | | 11/1994 | Swanson | |
| 5,369,304 A | | 11/1994 | Lesk et al. | |
| 5,444,271 A | | 8/1995 | Kuwahara | |
| 5,485,022 A | * | 1/1996 | Matsuda | ........................ 257/133 |
| 5,567,649 A | | 10/1996 | Lesk et al. | |
| 5,589,408 A | * | 12/1996 | Robb et al. | ...................... 438/273 |
| 5,608,238 A | | 3/1997 | Matsuda | |
| 5,661,314 A | | 8/1997 | Merrill et al. | |
| 5,698,867 A | | 12/1997 | Bauer et al. | |
| 5,723,349 A | * | 3/1998 | Fallica | ........................... 438/133 |

(Continued)

FOREIGN PATENT DOCUMENTS

JP 3-155677 A * 7/1991

*Primary Examiner* — Mary Wilczewski
*Assistant Examiner* — Toniae Thomas
(74) *Attorney, Agent, or Firm* — Farjami & Farjami LLP

(57) ABSTRACT

A semiconductor device is formed in a thin float zone wafer. Junctions are diffused into the top surface of the wafer and the wafer is then reduced in thickness by removal of material from its bottom surface. A weak collector is then formed in the bottom surface by diffusion of boron (for a P type collector). The weak collector is then formed or activated only over spaced or intermittent areas. This is done by implant of the collector impurity through a screening mask; or by activating only intermittent areas by a laser beam anneal in which the beam is directed to anneal only preselected areas. The resulting device has an effective very low implant dose, producing a reduced switching energy and increased switching speed, as compared to prior art weak collector/anodes and life time killing technologies.

13 Claims, 3 Drawing Sheets

U.S. PATENT DOCUMENTS

| | | |
|---|---|---|
| 5,723,882 A | 3/1998 | Okabe et al. |
| 5,795,793 A | 8/1998 | Kinzer |
| 6,031,254 A | 2/2000 | Quoirin |
| 6,043,112 A | 3/2000 | Francis et al. |
| 6,198,115 B1 | 3/2001 | Francis et al. |
| 6,239,466 B1 | 5/2001 | Elasser et al. |
| 6,242,288 B1 | 6/2001 | Francis et al. |
| 6,426,248 B2 * | 7/2002 | Francis et al. ............... 438/197 |
| 6,753,580 B1 * | 6/2004 | Francis et al. ............... 257/367 |
| 2002/0019084 A1 * | 2/2002 | Francis et al. ............... 438/197 |
| 2005/0280076 A1 * | 12/2005 | Barthelmess et al. ......... 257/327 |

* cited by examiner

SEMICONDUCTOR DEVICE HAVING INCREASED SWITCHING SPEED

RELATED APPLICATIONS

This application is a divisional application of U.S. Ser. No. 09/565,973, filed May 5, 2000 and entitled A SEMICONDUCTOR DEVICE HAVING INCREASED SWITCHING SPEED and is related to application (IGBT WITH AMORPHOUS SILICON TRANSPARENT COLLECTOR—Richard Francis), U.S. Ser. No. 09/566,219, filed May 5, 2000; (DIODE WITH WEAK ANODE—Richard Francis, Chiu Ng and Fabrizio Rue Redda), U.S. Pat. No. 6,753,580, issued Jun. 22, 2004; (ANNEAL-FREE PROCESS FOR FORMING WEAK COLLECTOR—Richard Francis and Chiu Ng), U.S. Pat. No. 6,242,288, issued Jun. 5, 2001; and (PLURAL TAPERED HYDROGEN IMPLANTS FOR BUFFER ZONE OF PUNCH-THROUGH NON EPI IGBT—Richard Francis and Chiu Ng), U.S. Ser. No. 6,482,681, issued Nov. 19, 2002.

FIELD OF THE INVENTION

This invention relates to semiconductor devices such as Insulated Gate Bipolar Transistors (IGBTs) and more specifically relates to a novel process for the manufacture of non-punch IGBTs formed in float zone (FZ) material in which a lightly doped weak collector permits an increased device switching speed.

BACKGROUND OF THE INVENTION

IGBTs employing a weak collector are well known. Such devices, using a non-punch through technology, and using ultra-thin float zone wafers rather than more expensive wafers with an epitaxially formed silicon layer for device junctions and buffer zones for example, are described in a paper 0-7803-3106-0/96; 1996 I.E.E.E., entitled NPT-IGBT-Optimizing for Manufacturability, in the names of Darryl Burns et al.

As described in that paper, high voltage non-punch through IGBTs (NPT-IGBTs) offer reasonable on state voltages, high short-circuit ruggedness, and minimal turn-off losses without heavy metal or E-beam lifetime killing. In addition, they have reduced cost as compared to the more conventional epitaxial IGBT because they are fabricated on low-cost bulk (float zone) silicon substrates and do not use thick, expensive epitaxial layers. The final thickness of the float zone wafers for non-punch thru IGBTs ranges from about 80 microns for 600 volt devices to 250 microns for 1700 volt devices. Even thinner wafers are needed for even lower breakdown voltages. Such wafers are fragile and subject to breakage during processing. Typically, the wafer will be about 80 microns thick for a 600 volt breakdown and 185 microns thick for a 1200 volt breakdown.

The known NPT-IGBT uses a simple, shallow low concentration backside P type implant (a "weak" or "transparent" collector) to form an emitter with low efficiency, thereby providing fast turn-off time. A collector contact including a first aluminum layer is then sintered into the bottom of the silicon wafer. In contrast, the conventional epitaxial IGBT uses an N+ epitaxial buffer layer and lifetime killing to obtain fast turn-off time.

The weak collector in an IGBT has been found to improve the relation between forward voltage drop ($V_{ce}$) and switching speed, as compared to that obtained by E beam radiation or heavy metal implants. Thus, in FIG. 6, the forward voltage drop $V_{ce}$ is shown as a function of switching energy E (which is inversely proportional to switching speed) at 150° C. The use of heavy metals such as platinum to reduce lifetime produces a reduction in $V_{ce}$ in FIG. 6 at the expense of switching speed. E-beam radiation provides further improved $V_{ce}$ characteristics. The curve in FIG. 6 shows the best available improvement in speed using present implant techniques. The use of a weak collector in an ultra thin NPT float zone material provides even better results than E-beam radiation. However, it has not been possible in the past to increase speed (reduce switching energy) into the dotted line region of FIG. 6. This is because it is difficult to control low implant doses in the range of 1E10 atoms/cm² to 5E11 atoms/cm². It would be very desirable to provide a device with higher switching speed for numerous applications.

BRIEF DESCRIPTION OF THE INVENTION

In accordance with the present invention, it has been found that the formation of a large number of spaced activated weak collector (or anode) segments over a single die area will produce a device which has characteristics along the dotted line portion of FIG. 6, particularly devices with a higher speed, than was heretofore possible. More specifically, a plurality of small spaced dot-like cathode areas produce this improved characteristic. Breaking up the collector regions, in effect, reduces the average dose to well controlled average values in the 1E10 to 5E11 atoms per cm² while using higher more accurately controlled implant doses.

This characteristic can be obtained, for example, by disposing a screen mask into and perpendicular to the higher dose implant ion beam which forms the weak collector region. Such screens can be formed by a nickel foil having the desired screen pattern. Alternatively, a full area, continuous implant, can be made, which is activated only at spaced locations over the surface by a suitably controlled laser beam heat source.

DETAILED DESCRIPTION OF THE DRAWINGS

Figure 1:
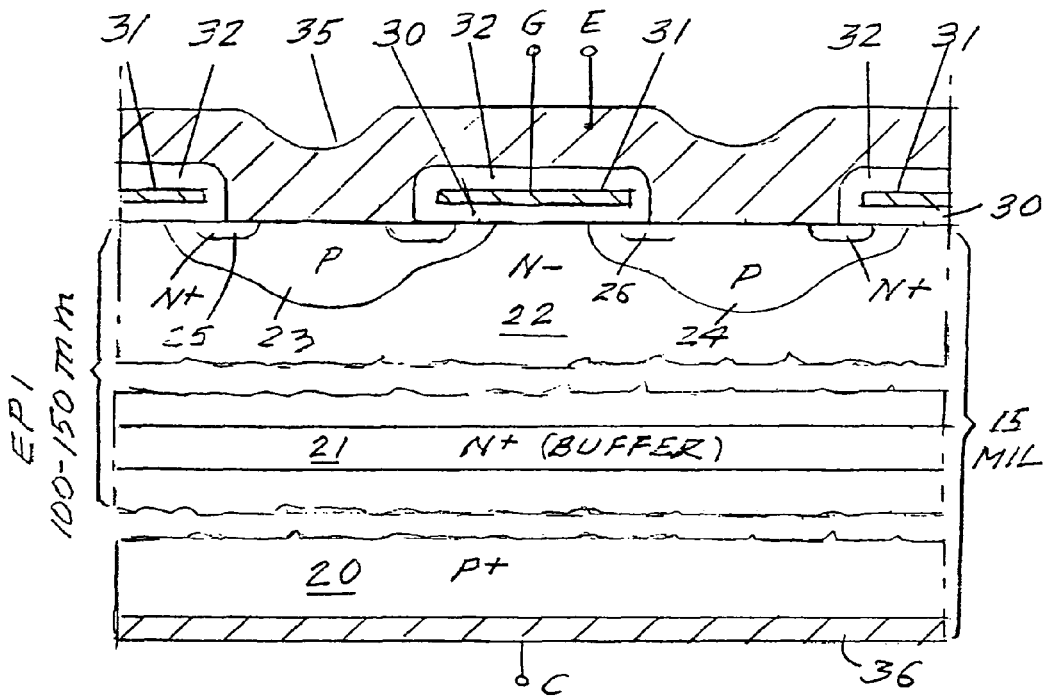
FIG. 1 is a cross-section of a small portion of a typical prior art type of IGBT formed in the upper epitaxial surface of a silicon wafer.

Referring first to FIG. 1, there is shown a small portion of a typical prior art IGBT formed in an epitaxial layer of silicon and using punch-through technology. Thus in FIG. 1, a P+ silicon body 20 is provided which has an epitaxially grown N+ buffer layer 21 and a junction receiving epitaxially grown N-layer 22 atop layer 21. For an N channel device, epitaxial layer 22 receives P type conventional base or channel diffusions 23 and 24, which may be polygonal cells having a central P+ body and an outer lighter doped P− region which receives source rings 25 and 26 respectively. [These concentrations will be reversed for a P channel device.] The source rings 25 and 26 may have conventional inwardly projecting bars (not shown) to ensure contact to an emitter electrode.

The invertible channel areas of channel regions 23 and 24 are covered by a gate oxide lattice 30, which, in turn, is covered by a conductive polysilicon gate lattice 31. A low temperature oxide (LTO) 32 then covers the polysilicon gate lattice 31 to insulate it from a continuous aluminum emitter electrode 35. A collector (anode) electrode 36 is then connected to the bottom of the P+ wafer.

The junction pattern shown in FIG. 1 is illustrative of that of a conventional DMOS punch-through type of epitaxial IGBT. A very large number of polygonal cells symmetrically arranged over the surface of the silicon will be used, with a conventional termination structure (not shown). The process techniques of U.S. Pat. No. 5,661,314 or U.S. Pat. No. 5,795,793 may be used. While a polygonal cell configuration has been described, any other geometry can be used, such as a stripe topology, or a trench topology.

The starting wafer of FIG. 1 will have a diameter of, for example, 150 millimeters, and a thickness of about 400 to 500 microns. The epi layer 22 is from 60 to 150 microns in thickness, depending on the desired voltage rating of the die being formed. Thus, the wafer is strong enough to be handled without breakage during its processing, using due care not to apply excess stress to the wafer. After processing, the wafer will be diced into a large number of identical die which can be packaged or otherwise used. Note that the terms wafer and die are frequently interchanged herein.

Figure 2:
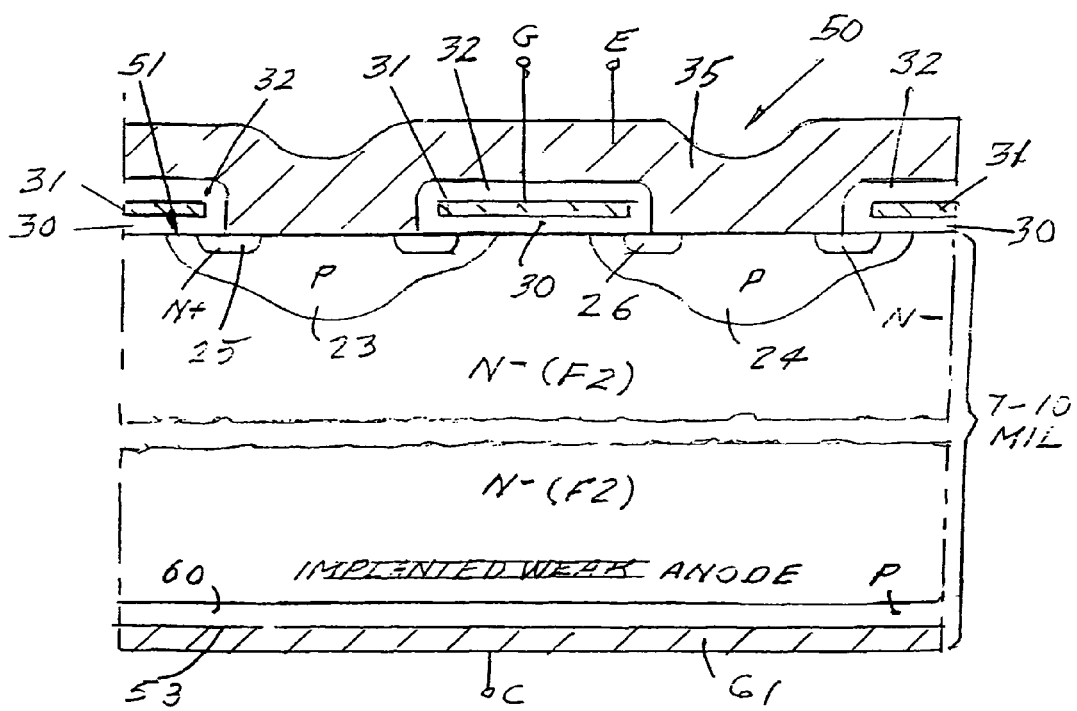
FIG. 2 is a cross-section similar to that of FIG. 1 for a prior art type of NPT IGBT formed in float zone (FZ) material with an implanted weak collector.

FIG. 2 shows a prior art type of IGBT which is a non-punch-through device with DMOS junctions formed in float zone (FZ) monocrystalline silicon rather than epitaxial silicon. It is desirable to use the FZ wafers because they are much less expensive than wafers such as those of FIG. 1 which have epitaxially formed layers. Further, such FZ wafers have a uniform resistivity throughout their volume which enhances device optimization. Finally, the use of wafer grinding and etching to control the wafer final thickness makes it possible to control the final thickness within tight limits, for example, within 2.5 microns for a 185 micron thick layer. When using FZ material and NPT technology however, the reduced wafer thickness makes the wafer subject to breakage with even the most careful handling during fabrication.

In FIG. 2 the FZ wafer 50 will have a thickness of 80 to 250 microns, depending on the device breakdown voltage and will have an N concentration, also dependent upon breakdown voltage. The same junction pattern (the DMOS topside) as that of FIG. 1 is formed in the top surface 51 of FZ wafer 50 of FIG. 2 and the diffusions in the wafer of FIG. 1 are repeated in FIG. 2 and have the same numerals as FIG. 1.

It should be noted that the FZ wafer will have a greater initial thickness, for example, 400 to 500 microns during the process steps used to form the DMOS top surface of the IGBT, as shown in FIG. 2. This is necessary for the wafer to survive handling during the process steps used to form the top of the IGBT.

Figure 3:
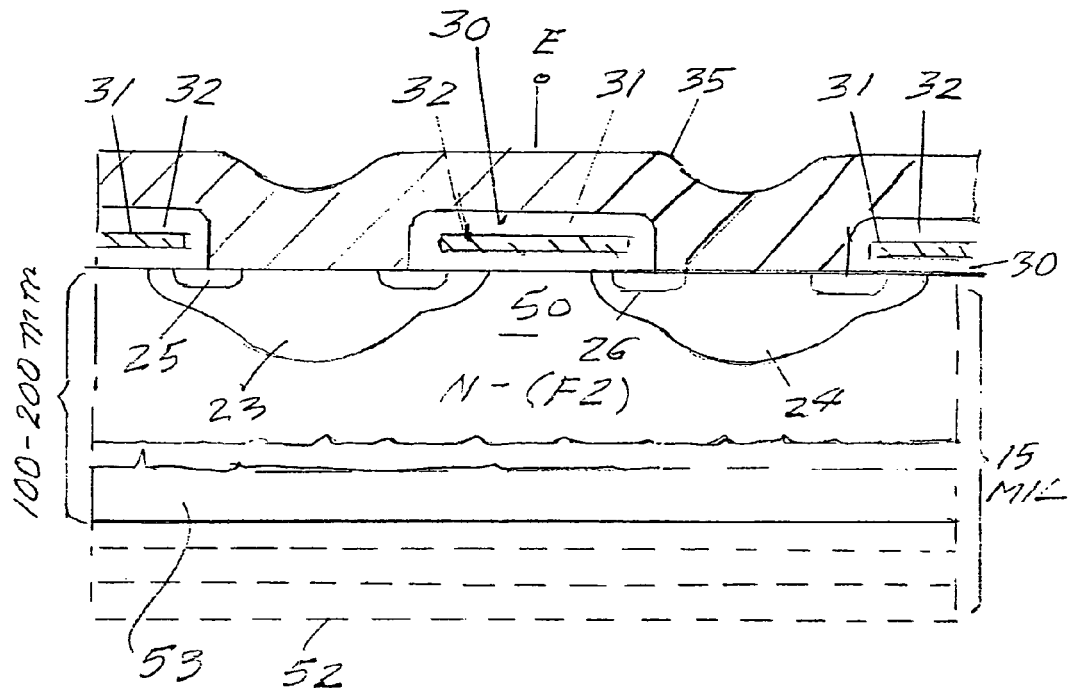
FIG. 3 shows the initial steps of the manufacturing process of forming the device junctions and top electrode for both the prior art process of FIG. 2 and for the present invention.

After the DMOS topside structure is completed, the bottom surface is ground back to location 52 in FIG. 3, making the wafer 50 close to its desired final thickness, dependent upon the desired breakdown voltage of the final die. After grinding, a 5 micron acid etch is used, for stress relief. Thus, as shown in FIGS. 2 and 3, the ground bottom surface of wafer 50 is acid etched (for stress relief) to surface 53 removing about 5 microns of material. This etch may employ a known acid mixture of sulfuric, phosphoric and hydrofluoric acids.

The next step in the manufacture shown in FIG. 2 is the formation of a weak collector 60 on the bottom surface 53 and the formation of a collector electrode 61 as shown in FIG. 2. Weak collector formation is a key process in the fabrication of the NPT IGBT. Thus, the performance of the NPT IGBT will be heavily dependant on the injection efficiency of collector 60. Conventionally, collector 60 is formed, before metallizing, by implantation of a P type dopant such as boron with an energy of 40 to 100 KeV. Region 60 may have a depth of about 0.5 microns. Depending on the desired switching speed, the boron implant dose will be about 1E11 to about 1E16 per cm$^2$ (faster speeds and corresponding higher forward voltage drops use the lighter dose). Following the implant step, the collector (anode) electrode 61 is created by sputtering Al/Ti/NiV/AG in that order on the wafer backside.

A conventional thermal backside anneal is carried out in the prior art, after forming the electrode 61. This anneal takes place at 300° C. to 400° C. for 30 to 60 minutes and is used to enhance the interaction of aluminum and the P type implanted silicon layer to create the weak collector of the IGBT.

The use of this conventional backside process has severe constraints. First, the thickness of NPT IGBT wafer is determined by the desired blocking voltage and can range from 80 microns for a 600 volt device to about 250 microns for a 1700 volt blocking voltage. In general, the lower the blocking voltage, the thinner the wafer must be. Wafer breakage can be excessive at these thicknesses so that the number of process steps and type of process equipment used in the "back end" fabrication process must be limited and well controlled.

A second constraint on the fabrication of NPT IGBTs is that the weak collector 60 is formed after the front side metallization and patterning (the DMOS top) are done. Therefore, all subsequent processes are restricted to temperatures well below 570° C. the eutectic temperature of aluminum/silicon.

Figure 4:
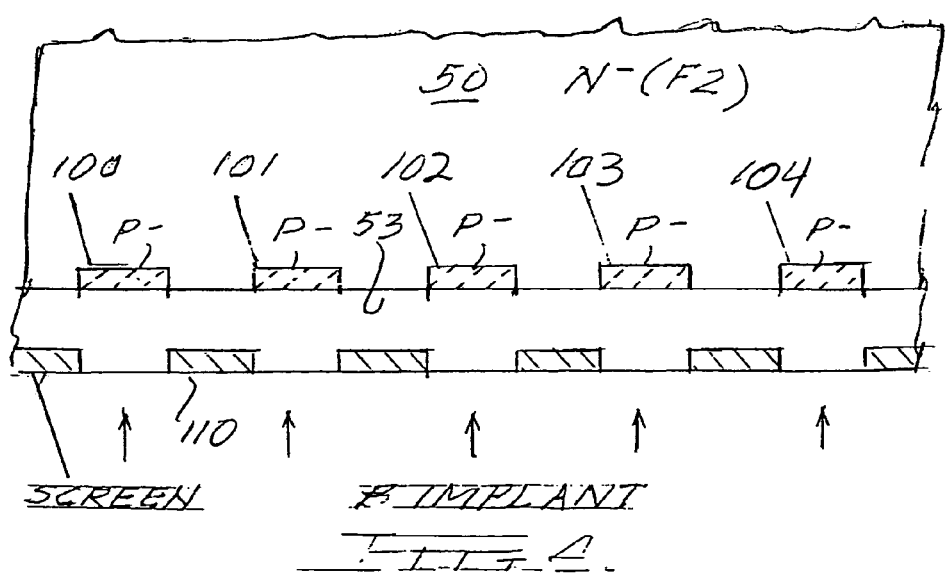
FIG. 4 shows the implant of boron ions into the bottom surface of the FZ wafer through a screen in accordance with the invention.

In accordance with the invention and as shown in FIG. 4, the weak anode 60 of FIG. 2 is modified to consist of a large plurality of separated segments 100 to 104 which may each have an area of typically 50×50 microns and a spacing of 50 to 200 microns. These may be deposited in spaced rows, although any desired geometry can be used. The implant dose used for the individual segments is in excess of about 5E11 atoms/cm$^2$ and is a value high enough that it can be accurately controlled.

Figure 6:
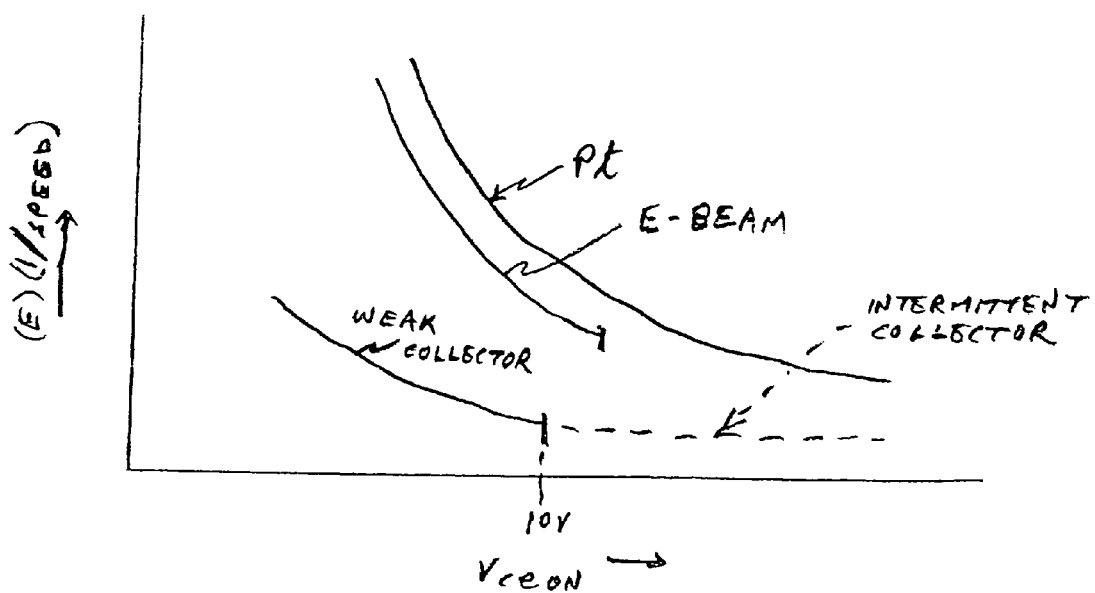
FIG. 6 shows the forward voltage drop $V_{ce}$ as a function of switching energy E for different lifetime killers and for a weak anode, including the weak anode of the invention.

It has been found that when the anodes 100 to 104 are activated, that the resulting device will have a faster switching speed (the dotted line region in FIG. 6) as compared to that of a device having a continuous weak anode as in FIG. 2 which has the characteristics shown by the solid line region in FIG. 6, and which are characteristic of a very low implant dose over the entire surface. That is, by spacing the implants for the weak collector, the system has the characteristics which would be produced by a much lower continuous implant.

The spaced activated regions 100-104 of FIG. 4 can be formed in any desired manner. Thus, a full area boron implant of 0.5 micron depth can be used, but activated only at the spaced regions 100 to 104 as by a suitably scanned laser beam which provides the necessary local activation anneal temperatures.

Figure 5:
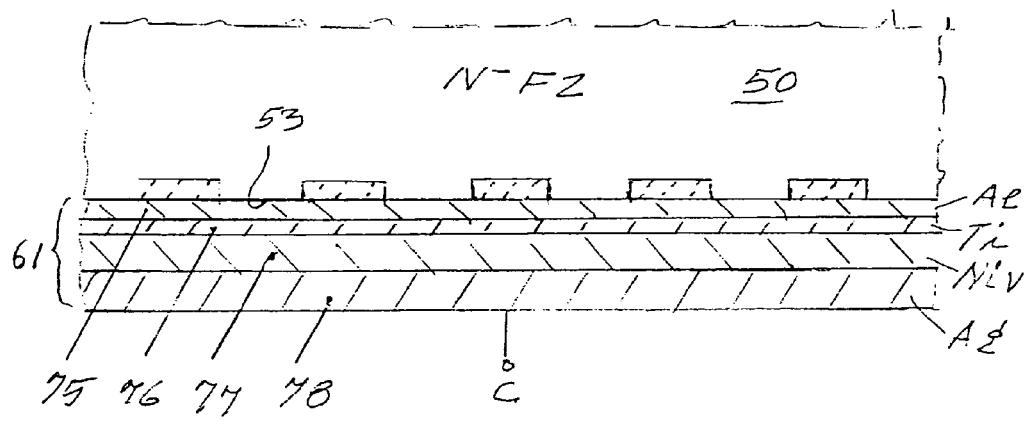
FIG. 5 shows the formation of a collector electrode on the bottom of the wafer of FIG. 4.

Alternatively, the boron or other impurity can be implanted through openings in a nickel foil or other screen 110 as shown in FIG. 4. Screen 110 can be laid atop the surface 53 if desired. Thus separated implants 100 to 104, each 0.5 micron deep, and shaped and spaced as defined by the screen mesh openings will be formed. The electrode 61 is subsequently applied and the regions 100 to 105 are activated by a suitable activation anneal. Thus, as shown in FIG. 5, following the formation of the weak collector regions 100, 101, 102, 103 and 104, the collector electrode 61 is applied to the bottom surface 53. Electrode 61 consists of segmentally deposited conductor layers 75, 76, 77, 78 of aluminum, titanium, nickel-vanadium and silver respectively.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of manufacturing a semiconductor device comprising:
   forming at least three spaced activated weak collector segments in one side of a semiconductor die of one conductivity, wherein the dose used for each individual segment is in excess of about 5E11 atoms/cm$^2$;
   wherein said semiconductor die is comprised of float zone type silicon; and
   wherein said segments are formed in a plurality of rows, wherein said plurality of spaced activated weak collector segments are formed by implanting dopants of another conductivity through a screen comprised of a Ni foil.

2. A method according to claim 1, wherein said plurality of activated weak collector segments are formed by a full area, continuous implant, and selective activation of spaced regions by a controlled laser beam heat source.

3. A method according to claim 1, wherein said semiconductor die is less than 250 microns thick.

4. A method according to claim 1, wherein said segments are activated, and thereafter a contact layer is formed on said one side.

5. A method according to claim 1, further comprising forming a plurality of DMOS structure in a surface opposite said one side of said semiconductor die.

6. A method according to claim 1, wherein each segment occupies an area of about 50×50 microns, and said segments are spaced 50 to 200 microns apart.

7. A method according to claim 1, wherein each segment is about 0.5 microns deep.

8. The process of manufacture of a semiconductor die; said process comprising the steps of:
   a) forming a plurality of junctions in the top surface of a float zone silicon wafer;
   b) forming a top electrode over the top surface of said wafer and in contact with selected ones of said junctions;
   c) thinning said wafer to a thickness less than about 250 microns by removing material from the bottom of said wafer;
   d) forming a plurality of spaced activatable weak injection anode type regions by an ion beam of particles of a conductivity type opposite to that of impurity carriers in said wafer through a masking screen to define said spaced weak anode regions in said bottom of said wafer;
   e) applying an aluminum electrode layer across the full area of said bottom surface of said wafer; and
   f) activating said spaced activatable anode type regions.

9. The process of claim 8, in which said junctions are DMOS junctions and said semiconductor die is an 1 GBT.

10. The process of claim 8, wherein said weak anode type regions are activated by an activation anneal after the application of an electrode to said bottom surface.

11. The process of claim 10, in which said junctions are DMOS junctions and said semiconductor die is an IGBT.

12. The process of claim 8, wherein said weak anode type regions are activated by sweeping an annealing laser beam over the surface of the bottom of said wafer and heating and annealing said spaced activatable weak anode type regions.

13. A method of manufacturing a semiconductor device comprising:
   forming a plurality of spaced activated weak collector segments in one side of a semiconductor die of one conductivity, wherein the dose used for each individual segment is in excess of about 5E11 atoms/cm$^2$; and
   wherein said plurality of spaced activated weak collector segments are formed by implanting dopants of another conductivity though a screen comprised of a Ni foil.

* * * * *